(12) United States Patent
Huang et al.

(10) Patent No.: US 7,477,000 B2
(45) Date of Patent: Jan. 13, 2009

(54) SURFACE ACOUSTIC WAVE DEVICE WITH ELECTRO-STATIC DISCHARGE PROTECTION

(75) Inventors: Yu-Tung Huang, Taipei (TW); Chi-Yun Chen, Longtan Township, Taoyuan County (TW); Shih-Cheng Chiu, Beidou Town (TW); Ken-Huang Lin, Kaohsiung (TW); Kuan-Yu Lin, Niaosong Shiang (TW)

(73) Assignee: Tai-Saw Technology Co., Ltd., Taoyuan (TW)

( * ) Notice: Subject to any disclaimer, the term of this patent is extended or adjusted under 35 U.S.C. 154(b) by 0 days.

(21) Appl. No.: 12/055,349

(22) Filed: Mar. 26, 2008

(65) Prior Publication Data

US 2008/0179990 A1    Jul. 31, 2008

Related U.S. Application Data

(62) Division of application No. 11/685,317, filed on Mar. 13, 2007, now Pat. No. 7,361,964, which is a division of application No. 11/126,671, filed on May 11, 2005, now Pat. No. 7,227,293.

(51) Int. Cl.
*H03H 9/25* (2006.01)
*H01L 41/047* (2006.01)

(52) U.S. Cl. .................................. 310/313 B; 310/365
(58) Field of Classification Search ............. 310/313 B, 310/363–365
See application file for complete search history.

(56) References Cited

U.S. PATENT DOCUMENTS

| | | | |
|---|---|---|---|
| 5,571,158 A | 11/1996 | Bolz et al. | 607/121 |
| 5,822,177 A | 10/1998 | Popp et al. | 361/508 |
| 6,768,397 B2 | 7/2004 | Takamine | 333/193 |
| 6,974,533 B2 | 12/2005 | Zhou | 205/264 |
| 7,154,207 B2 | 12/2006 | Sakaguchi et al. | 310/313 |
| 7,227,293 B2 | 6/2007 | Huang et al. | 310/313 B |
| 7,245,196 B1 * | 7/2007 | Baliarda et al. | 333/219 |
| 2002/0097059 A1 | 7/2002 | Tartagni et al. | 324/687 |
| 2002/0193837 A1 | 12/2002 | Hutten et al. | 607/11 |
| 2004/0007759 A1 | 1/2004 | Chu et al. | 257/528 |
| 2004/0012913 A1 | 1/2004 | Andelman | 361/503 |
| 2005/0231213 A1 | 10/2005 | Chou et al. | 324/662 |

FOREIGN PATENT DOCUMENTS

WO        WO 02/29836        4/2002

* cited by examiner

*Primary Examiner*—Thomas M Dougherty
(74) *Attorney, Agent, or Firm*—Kusner & Jaffe

(57) ABSTRACT

Sacrificial electrodes with fractal-shaped are formed on a SAW (surface acoustic wave) device. The sacrificial electrodes discharge electro-static charge in the SAW device for protecting the IDT (inter-digital transducer) from electro-static break. Moreover, the sacrificial electrodes can control the path and the discharging degree of the electro-static discharge to avoid losing the electro-static discharge protection due to the sacrificial electrodes are broken.

9 Claims, 11 Drawing Sheets

SURFACE ACOUSTIC WAVE DEVICE WITH ELECTRO-STATIC DISCHARGE PROTECTION

RELATED APPLICATIONS

This application is a divisional of U.S. application Ser. No. 11/685,317, filed Mar. 13, 2007, now U.S. Pat. No. 7,361,964, which is a divisional of U.S. application Ser. No. 11/126,671, filed May 11, 2005 (now U.S. Pat. No. 7,227,293), said patent applications fully incorporated herein by reference.

FIELD OF THE INVENTION

This invention is related to a surface acoustic wave (hereafter referred to SAW) device with ESD (electrostatic discharge) protection, especially to a SAW device having sacrificial electrodes.

BACKGROUND OF THE INVENTION

Resistors, capacitors and inductances required in conventional filters or sensors may be replaced since the SAW device is capable of processing signals with the design of surface electrodes. The SAW device has the advantages of high performance, small size, low cost, and repetitive manufacturing. Therefore, the SAW device is important both in electronic industry and communication systems, especially in cellular phones which require high performance and small size.

Take SAW filter as an example, as shown in FIG. 1A, the piezoelectric substrate 10, such as quartz, Lithium Niobate or Lithium Tantalate, is coated with designed inter-digital transducers (hereafter referred to IDTs) 4 and 5 having interval D. After receiving high frequency signals 1, the IDT 4 will transform the received signals to surface acoustic waves 2. Then, the surface acoustic waves 2 are passed to IDT 5 through the piezoelectric substrate 10 and outputted after transformed to high frequency signals 3. In the aforementioned IDTs 4 and 5, each interval space between fingers is D, but these intervals may be changed or modified with different dimension according to the various demands or application. Hence, the input high frequency signals having the same resonance frequency with IDT 4 can be transformed to surface acoustic waves 2, and the surface acoustic waves 2 having the same resonance frequency with IDT 5 can be transformed to high frequency signals 3 efficiently. In above transformation, it is imperative to get rid of the unlimited signals and noises but let go signals with certain wavelengths (wavelength selection), to filter signals.

In the process of SAW device manufacturing, such as the procedure of forming IDTs, the SAW device has to bear some temperature rise and fall treatment such as the thermal cycle for curing photo-resistance. For the piezoelectric substrate is made of thermoelectric materials, the change in temperature would produce ionization electrons accumulated on the SAW device so as to generate electrostatic charges. The electrostatic discharge will damage the SAW device as well as alter their characteristics. In view of this, as shown in FIG. 1B, the Japan Patent No. 6-224682 discloses that not only IDTs 14a, 15a and reflection portions 14b, 15b, but also the sacrificial electrodes 16a, 17a for destroying the electrostatic charges are formed on the input electrode 12 and output electrode 13 of the piezoelectric substrate 11. Because of the sacrificial electrodes, the electrostatic discharging would take place on the sacrificial electrodes rather than IDTs 14a and 15a.

Although aforementioned structure makes the electrostatic discharging occur on the sacrificial electrodes, however, it is not easy to control the discharging process, sometimes excessive electrostatic discharge would still destroy the sacrificial electrodes, thereby leading the sacrificial electrodes fail to perform the protection function. Hence, if there are more electrostatic charges, they may discharge on the IDTs 14a, 15a and the characteristics and functions of them would be altered and destroyed. Concerning the excessive electrostatic discharge, the other disadvantage is that the sacrificial electrodes will melt to contact each other to cause short circuit. Accordingly, Japan Patent No. 8-321739 improves forgoing structure. Resistant films 16 and 17 are attached on the sacrificial electrodes 16a and 17a to increase their resistance against electrostatic discharge, as shown in FIG. 1C. The IDTs can be reused to protect the SAW device from electrostatic discharge. However, the structures both require higher specific surface area to attain better resistance against electrostatic discharge. Besides, the path of electrostatic discharge is not controllable, and the sacrificial electrodes are those with smaller digital intervals. The oscillation thereof would influence the characteristics of the SAW device, so the sacrificial electrodes 16a, 17a must be disposed perpendicular to the IDTs 14a, 15a, respectively.

Japan Patent No. 5-121993 discloses another SAW device protection structure, as shown in FIG. 1D. Generally, the horizontal fingers 25, 27 are formed on the front end of the middle between the fingers 24a, 24b and 26a, 26b of the IDT 22 (23) to prevent the ESD break. This structure will increase the capacity of electrostatic charges and then effect the oscillation of the SAW device. Consequently, the horizontal fingers 25, 27 are moved afterward to avoid foregoing problem. Nevertheless, with this structure, it is easy to occur electrostatic discharging to damage SAW device in the position designated P between two digital transducers. Another improved structure is shown in FIG. 1E, the horizontal fingers 25, 27 are extended to form horizontal fingers 28 and adjacent fingers are connected to avoid such a problem. In this way, the properties of frequency response will be altered. Besides, the scope of usage is limited since the energy loss increases during the filtering process.

U.S. Pat. No. 6,034,578 discloses a SAW device with discharge electrodes electrically independent from the IDTs. As shown in FIG. 1F, IDTs 32, input wire bonding pad 33, output wire bonding pad 34, ground wire bonding pads 35, common electrodes 36, and thin film electrodes 37a, 37b, 37c and 37d are provided on the piezoelectric substrate 31. The thin film electrodes 37a, 37b, 37c and 37d are not connected to any aforementioned elements and electrically independent from them. In addition, the spaces S1 between the thin film electrodes 37a and 37b as well as between 37c and 37d are smaller than the spaces S2 and S3 between IDTs 32. The generation of electric charges due to spontaneous polarization is not uniform, and the quantity of charge generation is largest in the dicing margin portion. Since the space S1 is set to be sufficiently narrow, the static electricity is discharged between the thin film electrodes 37a and 37b or between 37c and 37d selectively. Accordingly, there is no fear that the IDTs 2 are subject to ESD breaking. However, this structure requires additional regions to dispose thin film electrodes 37a-37d so that the size thereof increases. Besides, there exist electrostatic charges in the inner region of thin film electrodes 37a-37d, too. These charges would attach to the elements such as IDTs 32. Since IDTs 32 are electrically independent from thin film electrodes 37a-37d, these electrostatic charges cannot be transferred to thin film electrodes 37a-37d. Hence, IDTs may suffer electrostatic breaking.

FIG. 1G shows a SAW device with the protection against electrostatic breaking according to U.S. Pat. No. 6,486,752.

The digital transducers 41, 42, and 43 forms first IDTs 61, and the digital transducers 44, 45 and 46 forms second IDTs 62. The IDTs 61 and reflectors 63, 64 and 65 are combined with the series connected resonator, and the IDTs 62 as well as reflectors 67, 68, 69 and 70 are combined with the parallel resonator. The digital transducers 42 and 45 respectively connect to dicing line 55 via connection patterns 91 and 92. Digital transducers 41 and 44, 43, 46 connect to dicing line 55 via connection patterns 81, 84, 86, respectively. Reflectors 65, 66, 67 and 68 connect to dicing line 55 via connection pattern 86, and reflectors 63, 64, 69 and 70 connect to dicing line 55 via connection pattern 86, 82, 83, 85, respectively. Accordingly, all devices connect with dicing line 55 to discharge electrostatic charges thereon to avoid electrostatic break. But, the dicing line will be cut off so that the electrostatic protection vanishes. It is unavoidable to suffer electrostatic break for package process.

SUMMARY OF THE INVENTION

In view of the aforementioned problems, one purpose of this invention is to provide a SAW device with ESD protection, so as to prevent the SAW device from electrostatic break.

Another purpose of this invention is to provide a sacrificial electrode with small specific surface area so that the required area of the sacrificial electrode would be smaller.

Yet another purpose of this invention is to provide a sacrificial electrode with fractal configurations, so as to control the discharging path and intensity.

Yet another purpose of this invention is to provide a sacrificial electrode with simple manufacturing process.

Still another purpose of this invention is to prevent the sacrificial electrode from melting to cause short circuit for electrostatic discharge.

Still another purpose of this invention is to make electrostatic charges difficult to accumulate, so as to moderate the intensity of each discharging.

Still further purpose of this invention is to provide a sacrificial electrode with sustaining effectiveness during the entire manufacturing and packaging process of the sacrificial electrode.

According to above purposes, this invention provides a SAW device which comprises a piezoelectric substrate, an input inter digital transducer, an output inter digital transducer, an input sacrificial electrode, and an output sacrificial electrode. The input inter digital transducer is formed on the piezoelectric substrate and comprises a first digital structure and a second digital structure, which are interlaced with and electrically independent from each other. The output inter digital transducer is formed on the piezoelectric substrate and comprises a third digital structure and a fourth digital structure, which are interlaced with and electrically independent from each other. The input sacrificial electrode is formed on the piezoelectric substrate and comprises a first electrode and a second electrode, which are electrically independent from each other. The first electrode is electrically connected to the first digital structure and the second electrode is electrically connected to the second digital structure. The output sacrificial electrode is formed on the piezoelectric substrate and comprises a third electrode and a fourth electrode, which are electrically independent from each other. The third electrode is electrically connected to the third digital structure and the fourth electrode is electrically connected to the fourth digital structure. The first, second, third, and fourth electrodes include fractal configurations.

This invention provides a SAW device comprising a piezoelectric substrate, an input inter digital transducer, an output inter digital transducer, an input wire bonding pad, an output wire bonding pad, and an electrode set. The input inter digital transducer is formed on the piezoelectric substrate and comprises a first digital structure and a second digital structure, and the first and second digital structures are interlaced with and electrically independent from each other. The output inter digital transducer is formed on the piezoelectric substrate and comprises a third digital structure and a fourth digital structure, and the third and fourth digital structures are interlaced with and electrically independent from each other. The input wire bonding pad is electrically connected to the first digital structure, and the output wire bonding pad is electrically connected to the fourth digital structure. The electrode set is formed on the piezoelectric substrate and comprises a first electrode and a second electrode, which are electrically independent from each other. The first electrode is electrically connected to one of the first, second, third, and fourth digital structures. The second electrode is electrically connected to either the input or the output wire bonding pad. The first and second electrodes include fractal configurations.

This invention also provides sacrificial electrodes of a surface acoustic wave device for electrostatic discharge protection, the sacrificial electrodes comprising: a first sacrificial electrode electrically connected to an input bonding pad of the surface acoustic wave device; and a second sacrificial electrode electrically connected to an output bonding of the surface acoustic wave device; wherein the first and second sacrificial electrodes are electrically independent from each other and have fractal configurations.

DETAILED DESCRIPTION OF THE PREFERRED EMBODIMENT

Embodiments of the present invention will be described below. Except these embodiments, this invention can also be applied in other various embodiments. However, the present invention is defined by the accompanying claims rather than any embodiment.

To provide clear description and understanding, some parts of the drawings are not made according to actual scale, and irrelevant details are omitted.

The invention utilizes the concept that a fractal has infinite circumferences within the same measure of area. Thus, more discharging paths can be provided in an extremely small area, and the discharging position and intensity may be controlled by applying the nature of point discharge. Hence, the ability of ESD protection would be raised.

Figure 1A:
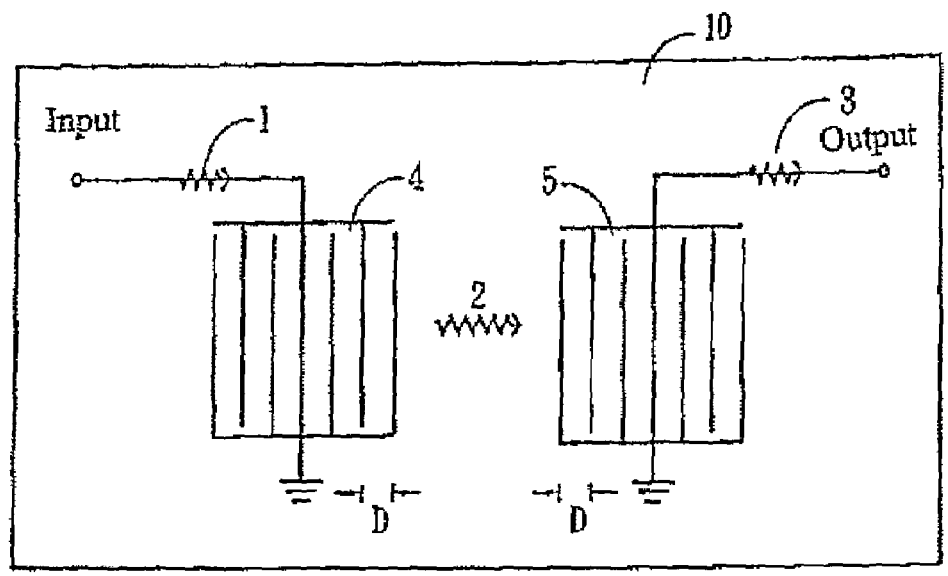
FIG. 1A presents the structure of a conventional SAW device.
Figure 1B:
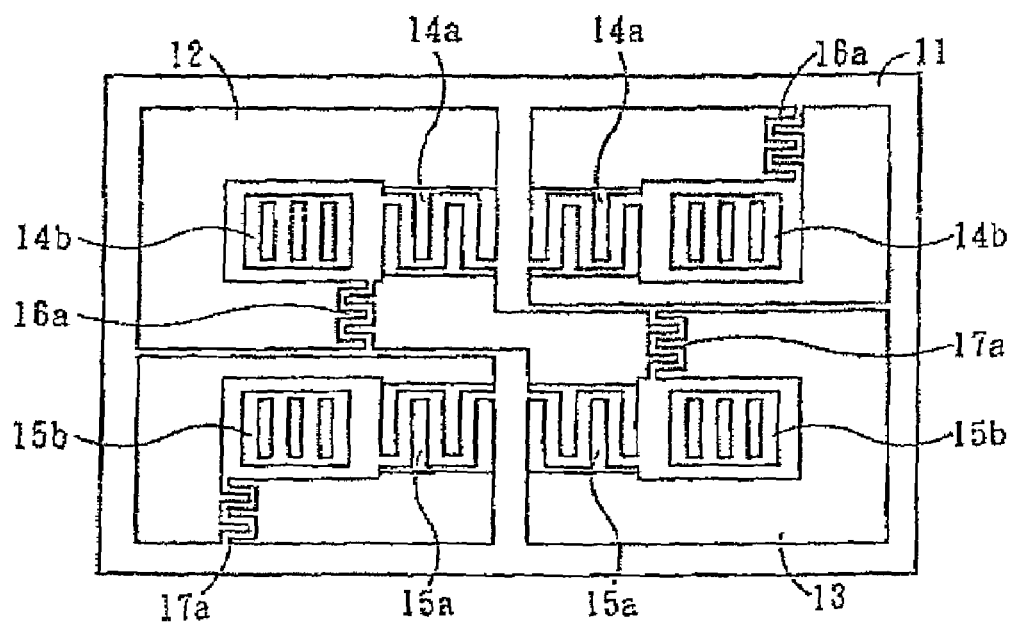
FIG. 1B-1G present the structure of conventional SAW devices with ESD protection.
Figure 1C:
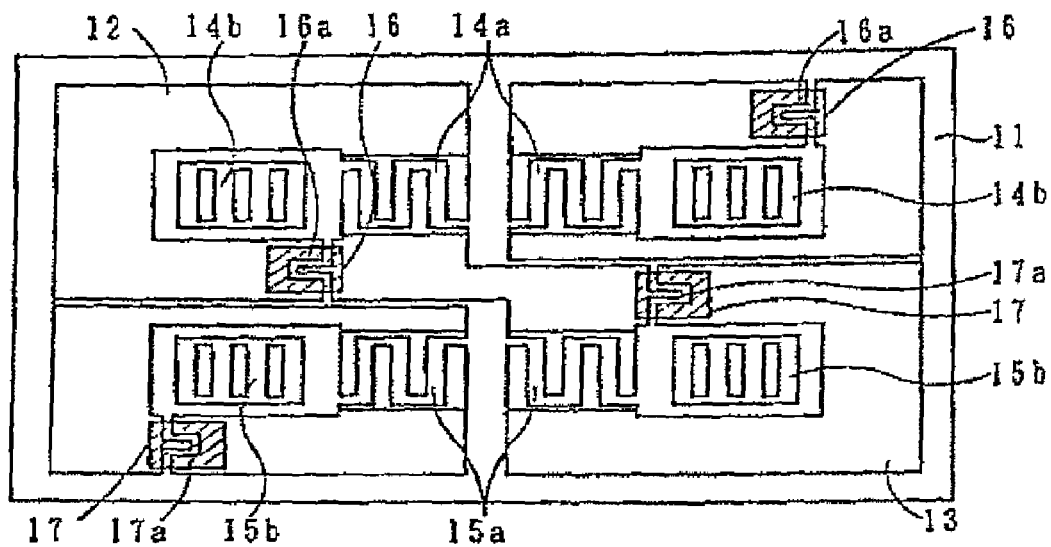
Figure 1D:
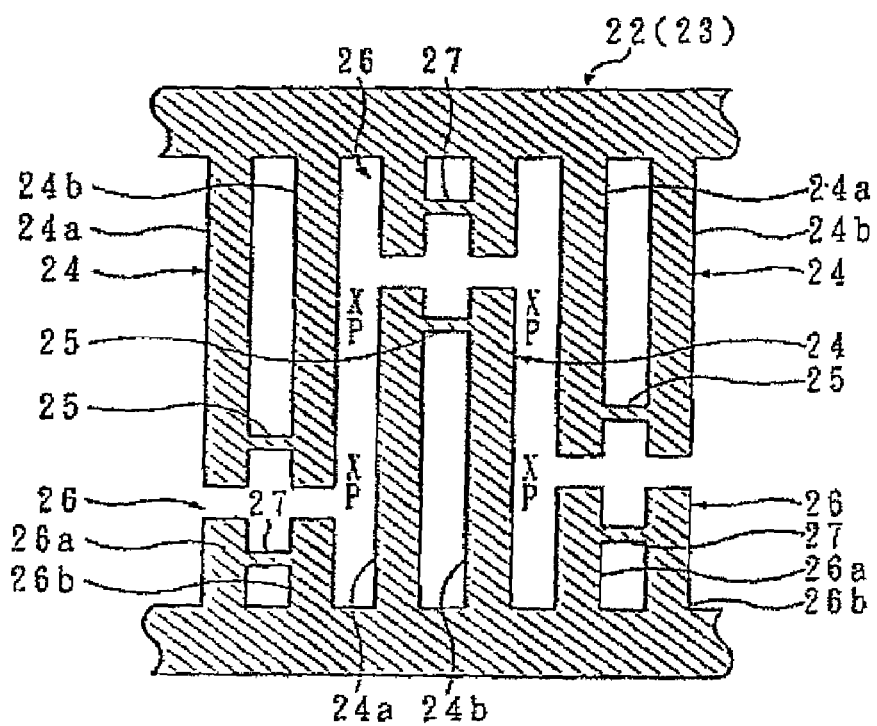
Figure 1E:
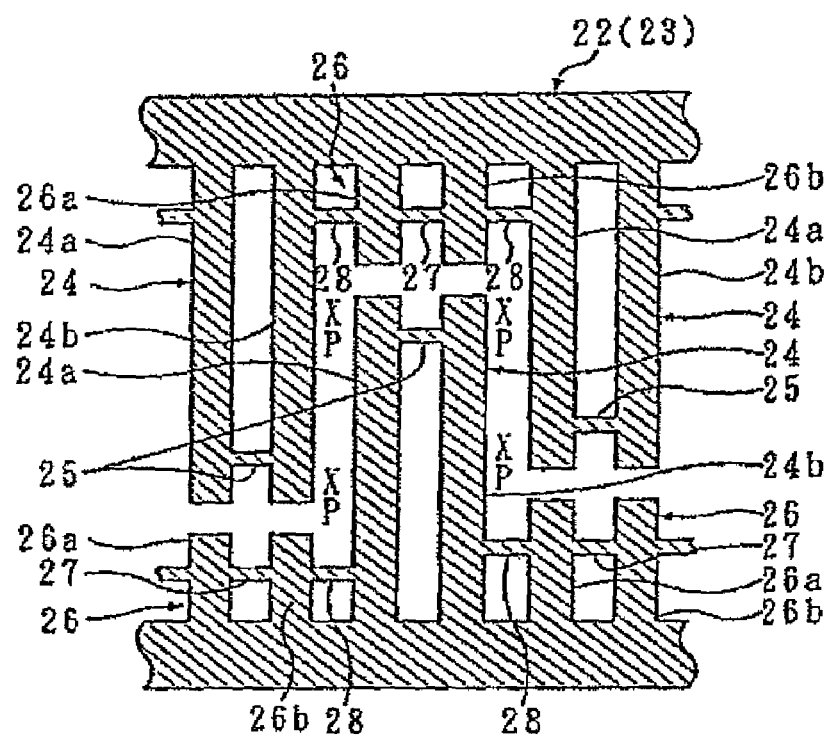
Figure 1F:
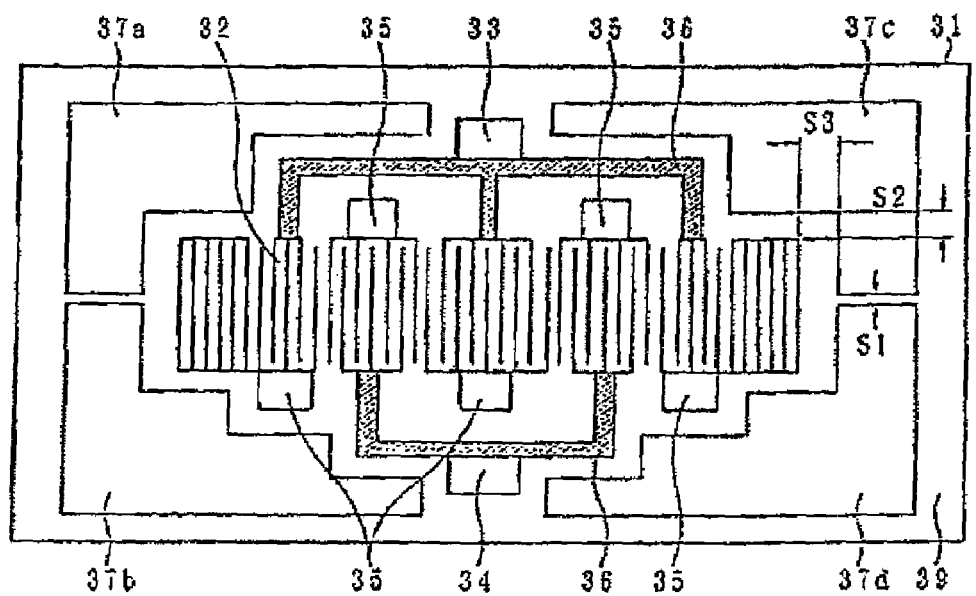
Figure 1G:
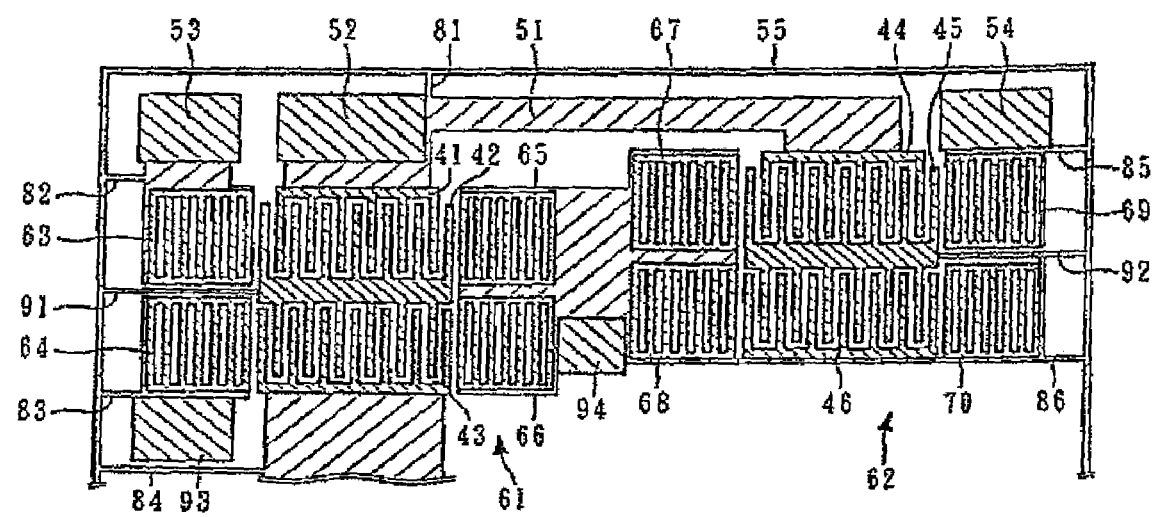
Figure 2A:
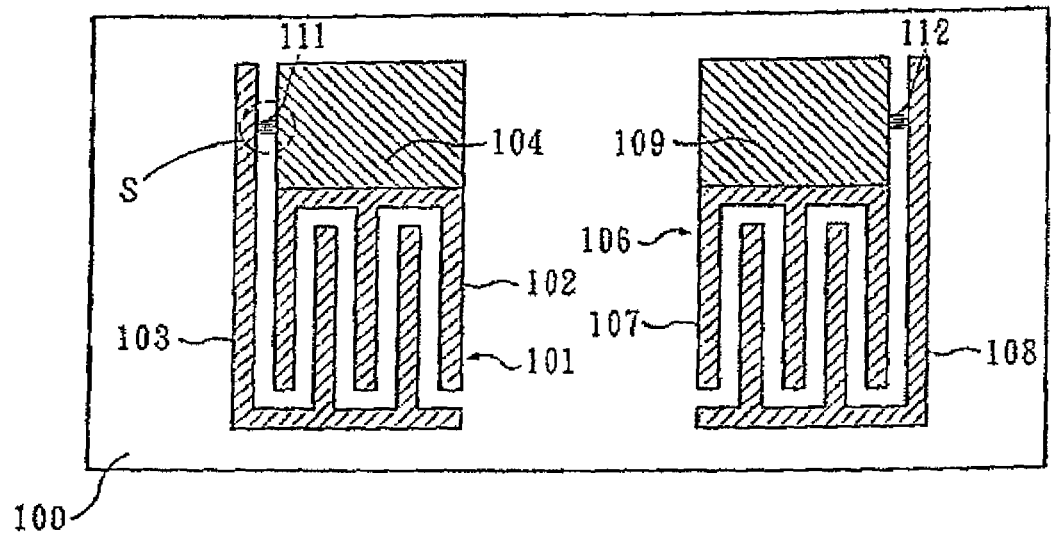
FIG. 2A presents the structure of one SAW device in according with this invention.

FIG. 2A presents one embodiment according to this invention. Input IDTs 101 and output IDTs 106 as well as input wire bonding pad 104 and output wire bonding pad 109 are formed on a piezoelectric substrate 100. The digital structures 102 and 103 constitute the input IDTs 101, wherein the digital structure 102 connect to input wire bonding pad 104 electrically. The digital structures 107 and 108 constitute the output IDTs 106, wherein the digital structure 107 connect to output wire bonding pad 109 electrically. The input digital sacrificial electrode 111 is formed by two electrically independent digital structures just as the input IDTs 101, and one of both electrically connects to digital structure 102 and the other to digital structure 103. The electrical connection type between output digital sacrificial electrode 112 and output IDTs 106 is identical to that between input digital sacrificial electrode 111 and input IDTs 101. As shown in FIG. 2A, only one of electrical connection type between digital sacrificial electrodes 111, 112 and IDTs 101, 106 is presented, and the configurations of the digital sacrificial electrodes 111, 112 are omitted since the size of digital sacrificial electrodes 111, 112 are far smaller than that of IDTs 101, 106.

Figure 2B:
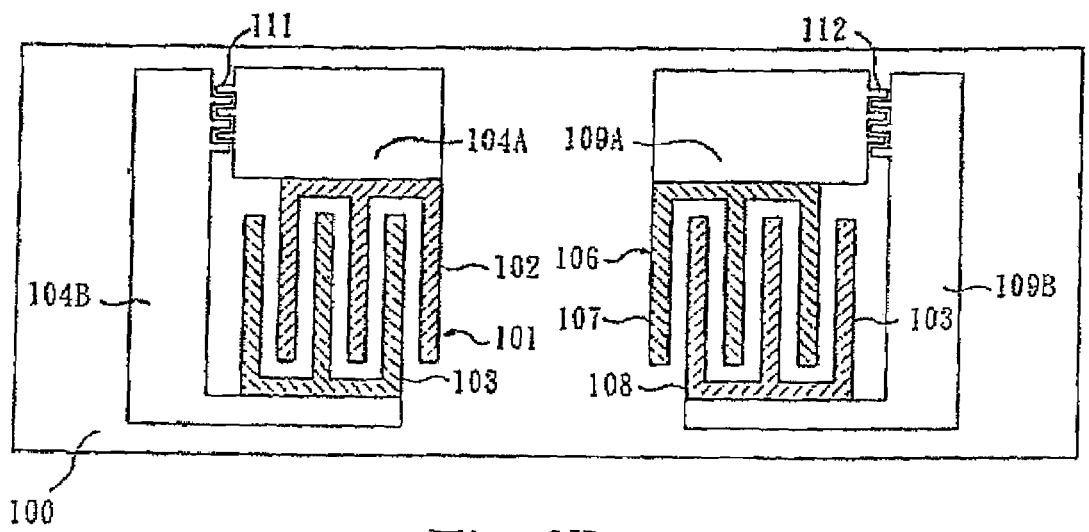
FIG. 2B presents the structure of another SAW device in according with this invention.

FIG. 2B presents another embodiment of this invention. The layout of digital sacrificial electrodes is different from that of FIG. 2A. Except input IDTs 101 and output IDTs 106, ordinary SAW device may also have input wire bonding pad 104A, 104B and output wire bonding pad 109A, 109B. The digital sacrificial electrodes 111, 112 may be one part of input wire bonding pads 104A, 104B and output wire bonding pads 109A, 109B, respectively. That is, digital sacrificial electrodes 111, 112 electrically connect to input wire bonding pads 104A, 104B and output wire bonding pads 109A, 109B.

Figure 2C:
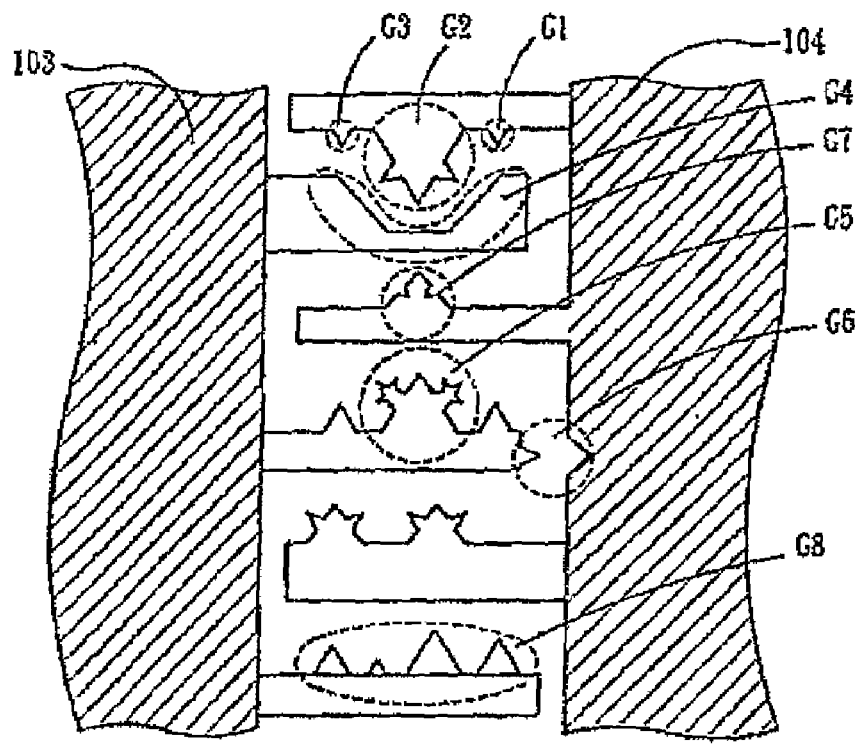
FIG. 2C presents the structure of a sacrificial electrode in according with this invention.

FIG. 2C is the partial enlargement of the region designated S in FIG. 2A and presents the structure of sacrificial electrodes. In this embodiment, triangles are used in the fractal of the digital structure as basic motif element. The shape of fractal is not regular in macro view, but when taking some part of the fractal, no matter how large the taken part is, a few common basic motif elements can be found (Self-duplication). Therefore, in FIG. 2C, the peripheral portions of digital transducers constituting the sacrificial electrodes are formed by triangles. These fractals formed on the sacrificial electrodes may only have basic triangles (first rank) as shown in regions G1, G3, or have smaller basic elements (second rank) on each basic triangle as shown in region G2. Besides, there may be further smaller basic elements formed on the second rank figures (third rank) as shown in region G5. Higher rank figures can be applied in this invention. The number of smaller basic elements on each basic element, i.e. the number of the (X+1)th rank figures on each Xth rank figure, is unlimited, and the rank order herein merely presents the stack sequence not the relative size. That is the (X+1)th rank figures formed on certain Xth rank figure, and the former may be larger than the latter. However, the (X+1)th rank figures are preferably smaller than Xth rank figures. In the present invention, the fractals may be protruding, concave, or both. The region G6 shows a concave triangle, and the region G7 illustrates a triangle with two smaller concave triangles formed thereon. The region G8 presents triangles with different heights.

Besides the triangles, other figures may be introduced in this invention to form the sacrificial electrodes. The introduced figures preferably have at least one sharp angle thereon. Two kinds of basic elements may be used to constitute one sacrificial electrode. Although all of the basic elements in FIG. 2C are not the same, the invention may adopt any combination of basic elements including the situation with only one kind of basic element. Moreover, the basic elements may not only be deposited on the long side of digital transducers but also on the short side, as shown in region G6 of FIG. 2C.

In FIGS. 2A, 2B, and 2C, the number and arrangement of transducers are presented for the purpose of illustration, not for limitation, and various number and arrangement may be applied in the invention according to different demands and purposes.

Figure 2D:
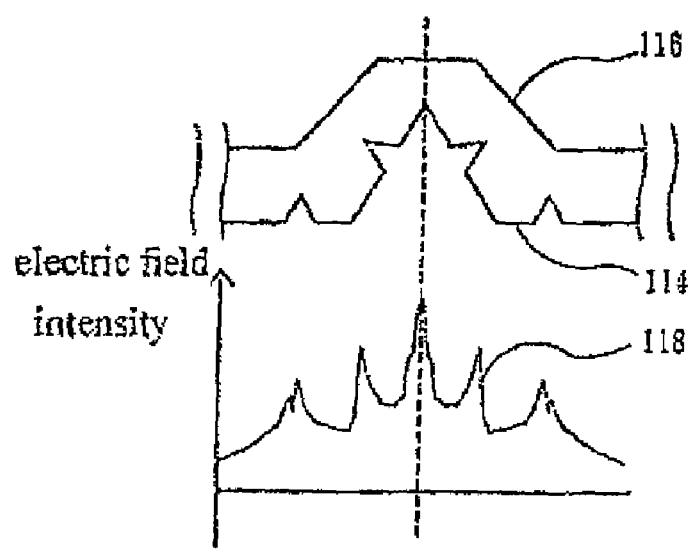
FIG. 2D presents the electric field distribution of partial sacrificial electrode.

The electric field intensity of adjacent digital transducers in regions G1, G2, G3, and G4 will be illustrated. Referring to FIG. 2D, edge 114 has protruding fractals and edge 116 has concave configuration corresponding to edge 114. It is obvious in electric field distribution curve 118 that the intensity is relatively higher at the tips of the triangles. Since the high electric field intensity regions tend to be formed at the tips of the triangles, the charges are mostly distributed thereon. Besides, the electric field intensity between tips is too low to let through the charges, so the charges are confined within these tips. Therefore, the electrostatic discharging path can be guided to these tips. After being discharged, the discharged tip will not receive any charge from the other tips, and the discharged tip will not be damaged due to excessive discharge. That is, discharging at each tip would cease right after releasing all of its charges, and therefore the process is quite mild.

Figure 2E:
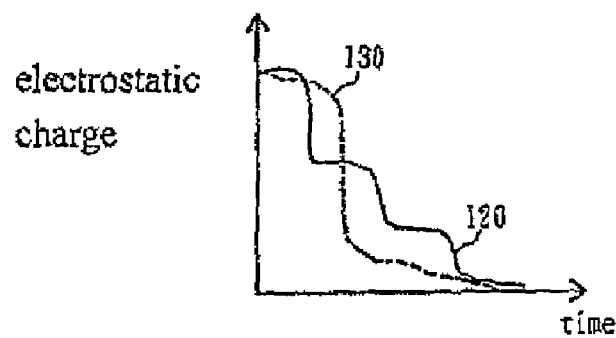
FIG. 2E presents the relationship between the electrostatic discharge and time.

In FIG. 2E, a dotted line 130 illustrates the relationship between the energy and time in conventional discharging process, and a line 120 presents the situation as applying the invention. Generally, the discharge would concentrate on certain point with highest electric field intensity, thus the change level of electrostatic charge would be so huge that the discharging point will be destroyed. However, the discharging in the present processes step by step, as shown in the line 120 of FIG. 2E. A plurality of tips would share all of the electrostatic discharge, so the process may be quite mild. Alternatively, the relationship between energy and time would be close to the dotted line 130 when the discharging at some tip triggers that at other tips. Since the discharges are distributed to a plurality of tips, the generated energy will not be so huge to damage any discharging point. Accordingly, in the invention, the discharging paths are controllable, the discharging process is mild, and the sacrificial electrodes would not melt to produce short circuit.

Figure 2F:
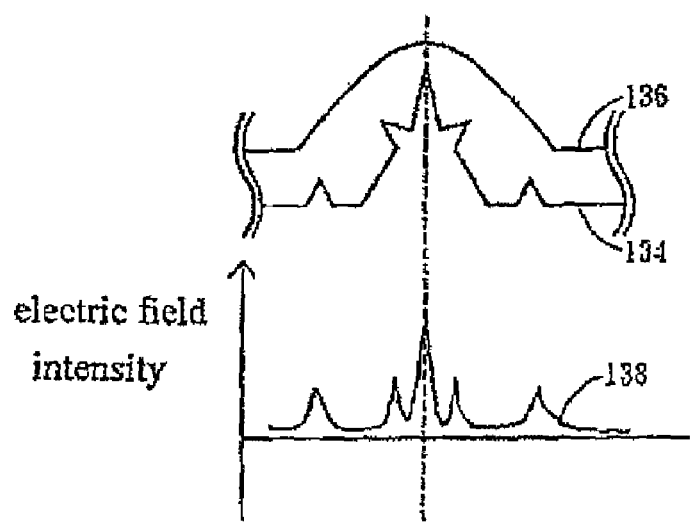
FIGS. 2F and 2G presents the electric field distribution of another sacrificial electrode.
Figure 2G:
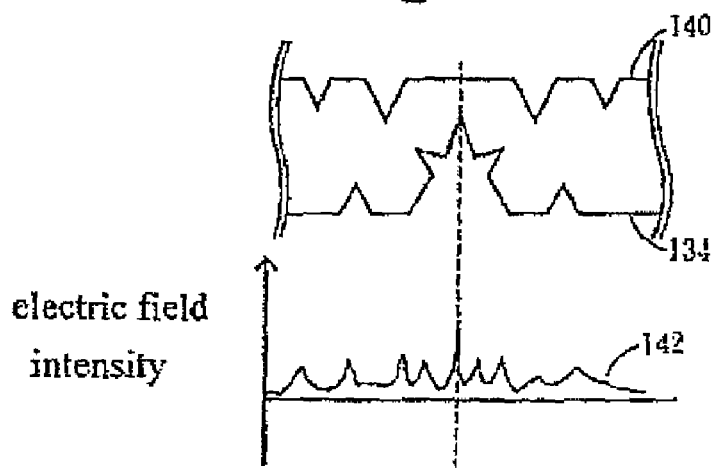
Figure 3A:
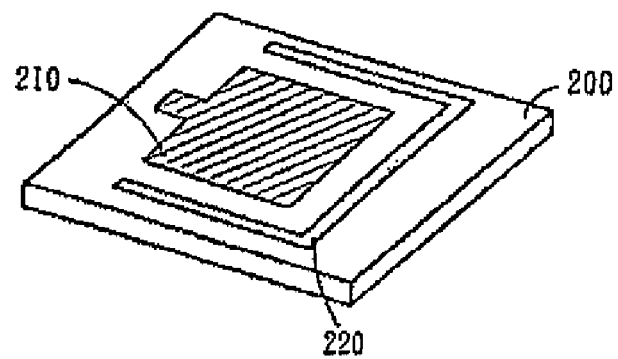
FIG. 3A presents the structure of original electrode without fractal configuration.
Figure 3B:
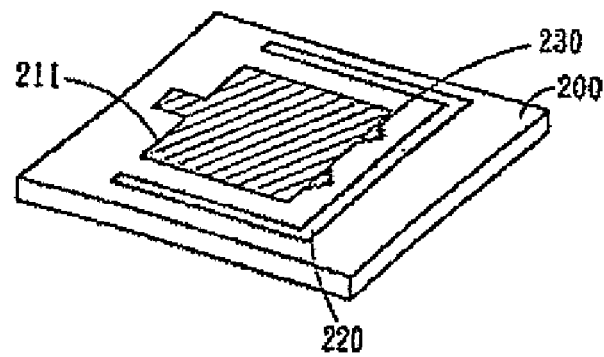
FIG. 3B presents the structure of electrode with fractal configurations in first rank.
Figure 3C:
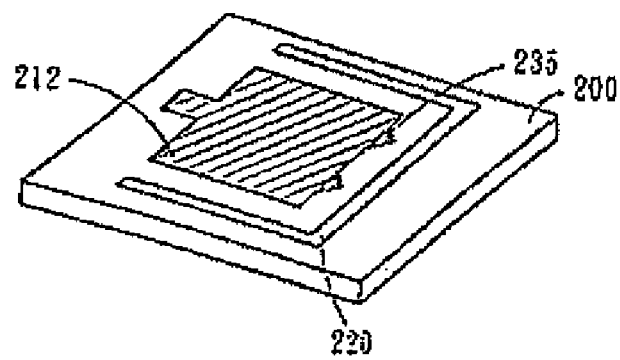
FIG. 3C presents the structure of electrode with fractal configurations in second rank.
Figure 3D:
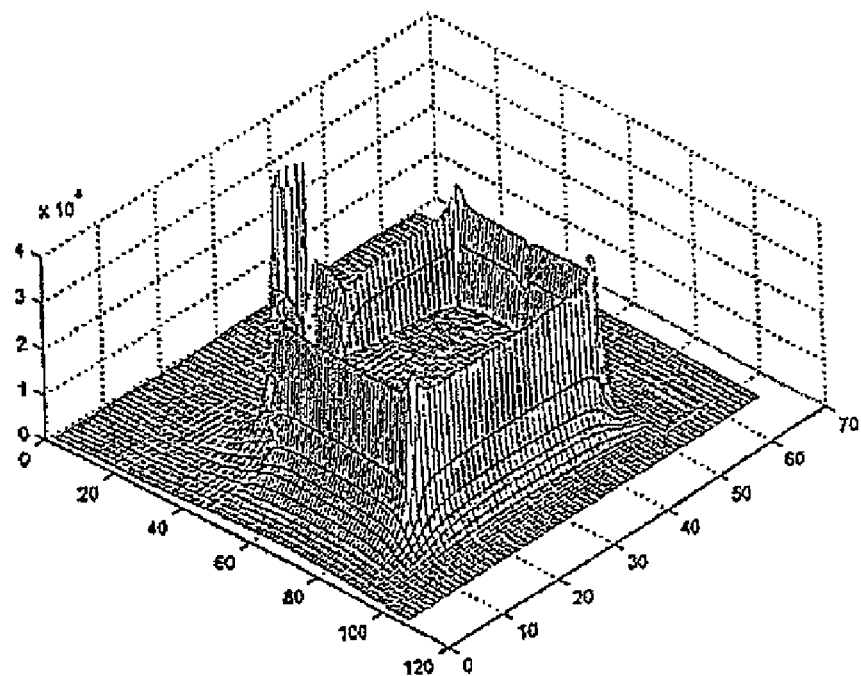
FIG. 3D presents the electric field distribution of the original electrode as shown in FIG. 3A.
Figure 3E:
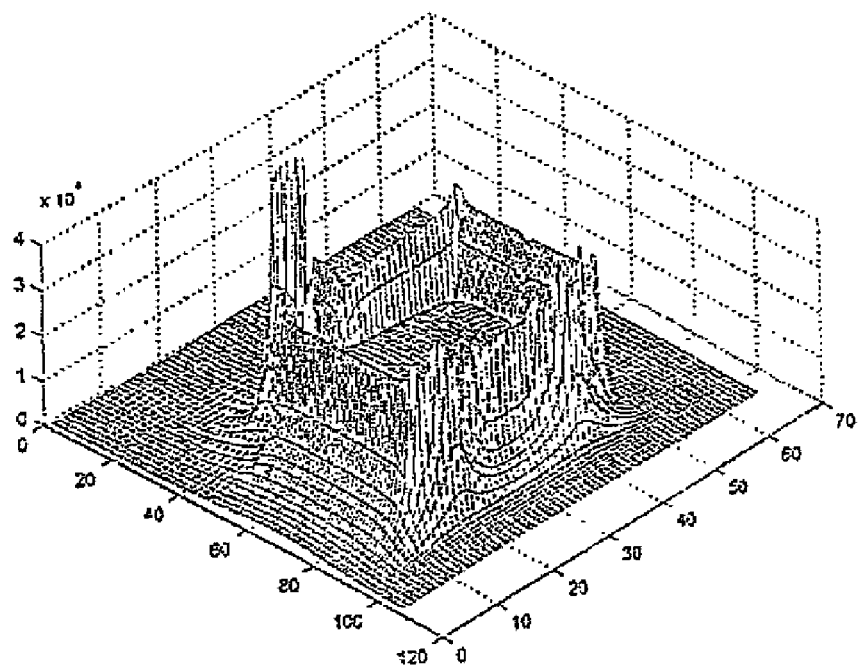
FIG. 3E presents the electric field distribution of the electrode with fractal configurations in first rank as shown in FIG. 3B.
Figure 3F:
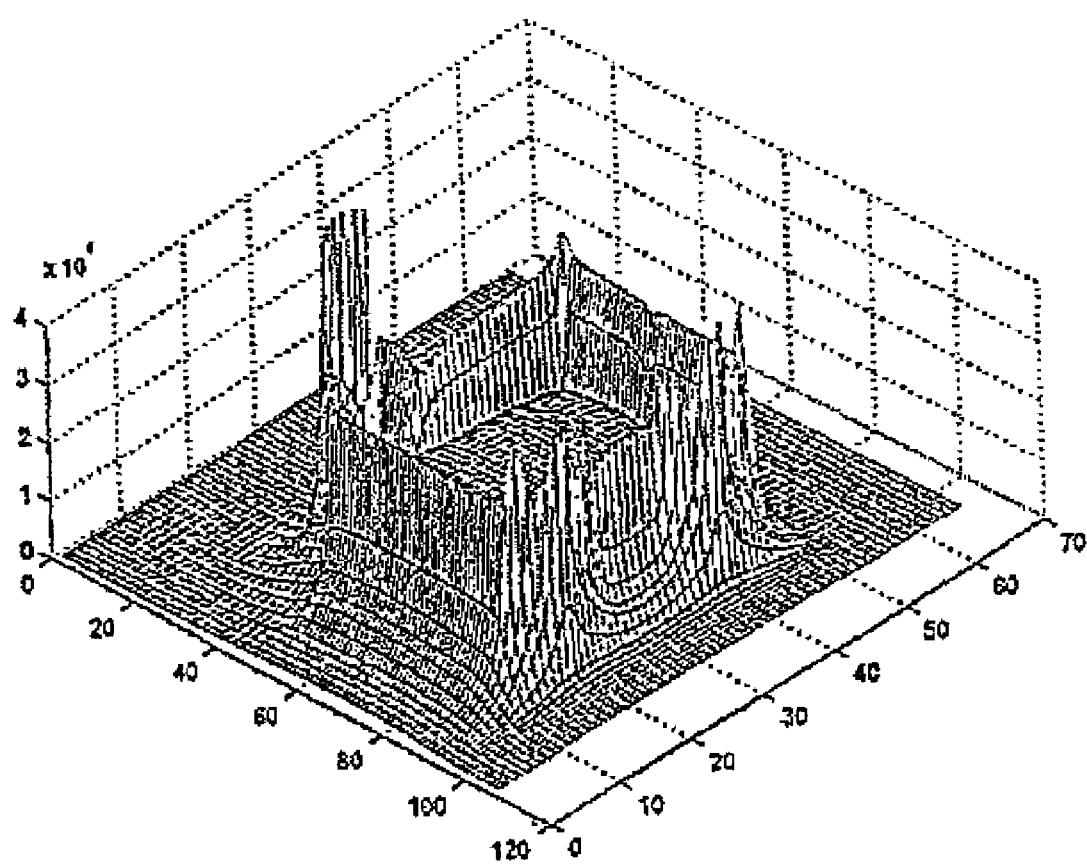
FIG. 3F presents the electric field distribution of the electrode with fractal configurations in second rank as shown in FIG. 3C.

As mentioned above, the invention utilizes the tips to discharge. Regarding the edge with protruding figures, except the edge with concave figures as shown in region G4, G6 of FIG. 2C and edge 116 of FIG. 2D, the adjacent edges may have the configurations of straight lines or arcs. FIG. 2F is similar to FIG. 2D excluding the edge corresponding to the protruding edge 134 is modified to the edge of arc configuration. Besides, the electric filed distribution curve 138 of FIG. 2F is like the curve 118 of FIG. 2C that the electrostatic field intensities at tips of triangles would be relatively higher. Hence, the configurations of corresponding edges are unlimited in the invention. The difference of shortest distance between each tip and its corresponding edge is preferably quite little to avoid the concentration of excessive energy. The distances between the edges of adjacent digital transducers are preferably 0.1 to 10 micrometer. Consequently, the protruding edge 134 may have a corresponding protruding edge 140, and the tips thereof may correspond to the concave of edge 134. The electric field distribution is shown in a curve 142. In this way, there are more discharging paths and the process would be much more moderate for the wide distribution of energy.

Additionally, more electrostatic discharging paths may be provided by utilizing the self-replication property of fractals. Hence, the other advantage of this invention is to reduce the required area of sacrificial electrodes significantly.

Other electric field distributions are presented on FIG. 3. As shown in FIG. 3A, two electrodes 210, 220 are formed on a substrate 200, wherein the electrode 210 without fractals is referred as original configuration. Electrode 211 has two fractal configurations in first rank 230, as shown in FIG. 3B. Electrode 212 has two fractal configurations in second rank 235, as shown in FIG. 3C. FIG. 3D presents the electric field distribution of electrode 210, and the electric field concentrate on electrode 210 since electrode 210 has no fractal configuration. FIG. 3D is made according to FIG. 3A. The electric field distribution of electrode 211 with fractal configurations in first rank 230 is illustrated in FIG. 3E. Comparing FIG. 3E with FIG. 3D, except the position of electrode 211, two places around coordinates (20, 90) and (40, 90) in FIG. 3E also have higher electric field intensity and do correspond to the fractal configurations 230 in FIG. 3B. The electric field distribution of electrode 212 with fractal configuration in second rank 235 is illustrated in FIG. 3F. Two places around coordinates (20, 90) and (40, 90) have higher electric field intensity and do correspond to the fractal configurations 235 in FIG. 3C. Comparing FIG. 3F with FIG. 3E, the electric field intensity generated by fractals in second rank is higher and there are more places having higher intensity. The electric field intensity would be higher and the point discharge may be more obvious if the fractal configurations are more complicated.

The electrodes of this invention may be made of pyroelectric material or piezoelectric material, such as barium titanate piezoelectric ceramic, lead titanate piezoelectric ceramic, lead titanate-zirconate piezoelectric ceramic, triple system piezoelectric ceramic, polymer piezoelectric material, and compound piezoelectric material. The electric dipole of the piezoelectric material would not work until being heated. Therefore, during manufacturing process the electrostatic charges generated by shifting temperature will be discharged instantly instead of accumulating. Moreover, the electrostatic charges generated by electromagnetic waves of SAW devices would be released due to the thermal energy produced by the SAW devices. For example, as a component of a cellular phone, the SAW device would have a temperature when the cellular phone is used, so as to discharge the sacrificial electrode. That is, whenever the SAW device is tend to generate electrostatic charges, the sacrificial electrode is also likely to be discharged. Consequently, each electrostatic discharging would be so mild that the sacrificial electrode may not be broken.

Figure 4:
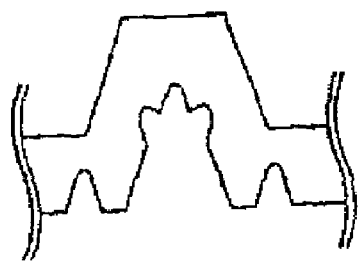
FIG. 4 presents the smoothed sharp angles of the sacrificial electrode.

Additionally, some defects are unavoidable in the manufacturing process of semiconductor devices (such as the edges of the configuration having some indentations or protrusions). However, the sacrificial electrodes of this invention could endure these defects well, and sometimes certain defects may work as electrostatic discharging paths. Therefore, the tolerance of the manufacturing process of the sacrificial electrodes is quite high and easy. The sharp angles of the sacrificial electrodes may melt to smooth corners as shown in FIG. 4, but their functions would not be influenced. Hence, the SAW devices are provided with ESD protection during the entire manufacturing and packaging process.

The sacrificial electrodes of this invention may be electrically independent from each other, and have fractal configurations as well as ESD protection. Moreover, the distance between two electrodes is not uniform for the irregularity of fractals. The sacrificial electrodes would neither affect the frequency of the SAW device nor have to be perpendicular to the IDTs. As shown in FIG. 2A or FIG. 2B, the two electrodes of the sacrificial electrode may be electrically connected to two elements or wire bonding pads of the semiconductor device. Alternatively, one electrode of the sacrificial electrode is electrically connected to any one element of the semiconductor device and the other electrode is electrically connected to any input or output terminal, such as a wire bonding pad.

Figure 5:
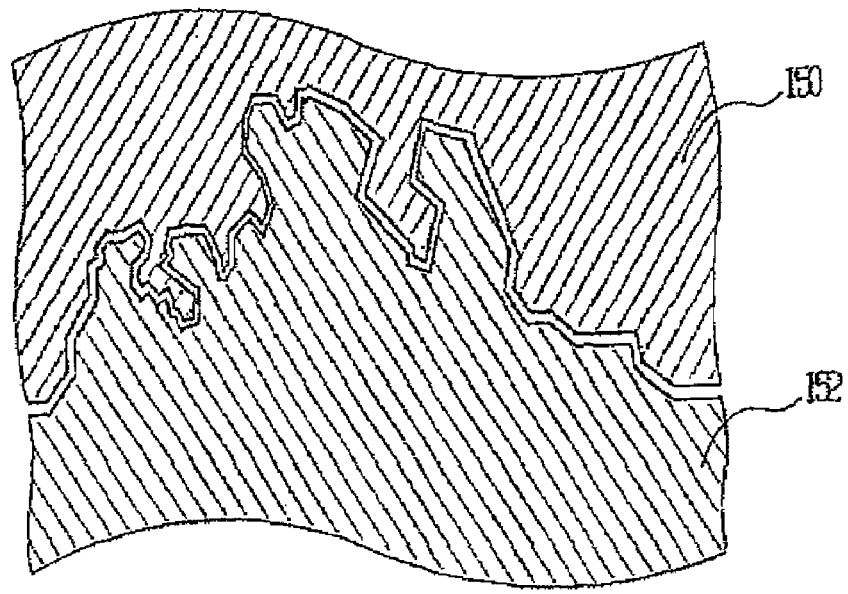
FIG. 5 presents the structure of the capacitor with fractal configurations according to this invention.

According to the characteristic of fractals, the size of opposite surfaces may be so large that the sacrificial electrode can be used as a capacitor. As a capacitor, the sacrificial electrode would rather discard the shape angles to avoid the point discharge. The edges of two electrodes are preferably parallel to each other, so the distance between entire edges is almost consistent. As shown in FIG. 5, the electrodes 150, 152 constitute a capacitor.

This invention provides a SAW device, which comprises a piezoelectric substrate, an input inter digital transducer, an output inter digital transducer, an input sacrificial electrode, and an output sacrificial electrode. The input inter digital transducer is formed on the piezoelectric substrate and comprises a first digital structure and a second digital structure, and the first and second digital structures are interlaced with and electrically independent from each other. The output inter digital transducer is formed on the piezoelectric substrate and comprises a third digital structure and a fourth digital structure, and the third and fourth digital structures are interlaced with and electrically independent from each other. The input sacrificial electrode is formed on the piezoelectric substrate and comprises a first electrode and a second electrode, which are electrically independent from each other. The first electrode is electrically connected to the first digital structure and the second electrode is electrically connected to the second digital structure. The output sacrificial electrode is formed on the piezoelectric substrate and comprises a third electrode and a fourth electrode, which are electrically independent from each other. The third electrode is electrically connected to the third digital structure and the fourth electrode is electrically connected to the fourth digital structure. The first, second, third, and fourth electrodes include fractal patterns with sharp angles, so as to electrostatically discharge thereat.

This invention provides a SAW device comprising a piezoelectric substrate, an input inter digital transducer, an output inter digital transducer, a input wire bonding pad, a output wire bonding pad, and an electrode set. The input inter digital transducer is formed on the piezoelectric substrate and comprises a first digital structure and a second digital structure, and the first and second digital structures are interlaced with and electrically independent from each other. The output inter digital transducer is formed on the piezoelectric substrate and comprises a third digital structure and a fourth digital structure, and the third and fourth digital structures are interlaced with and electrically independent from each other. The input wire bonding pad is electrically connected to the first digital structure, and the output wire bonding pad is electrically connected to the fourth digital structure. The electrode set is formed on the piezoelectric substrate and comprises a first electrode and a second electrode, which are electrically independent from each other. The first electrode is electrically connected to one of the first, second, third, and fourth digital structures. The second electrode is electrically connected to either the input or the output wire bond pad. The first and second electrodes include fractal configurations.

This invention also provides sacrificial electrodes for ESD protection of semiconductor device, which comprises an input sacrificial electrode and an output electrode. The input sacrificial electrode is electrically connected to an input terminal of the semiconductor device and the output terminal is electrically connected to an output terminal of the semiconductor device. The input and output sacrificial electrodes are electrically independent from each other. The configurations of the input and output sacrificial terminals are fractals with sharp angles, so as to discharge at the tips thereof.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Having described the invention, the following is claimed:

1. Sacrificial electrodes of a surface acoustic wave device for electrostatic discharge protection, said sacrificial electrodes comprising:

a first sacrificial electrode electrically connected to an input bonding pad of said surface acoustic wave device; and a second sacrificial electrode electrically connected to an output bonding of said surface acoustic wave device; wherein said first and second sacrificial electrodes are electrically independent from each other and have fractal configurations.

2. Sacrificial electrodes as in claim 1, wherein at least one basic motif element of said fractal configurations has sharp angles to discharge electrostatic charges of said surface acoustic wave device.

3. Sacrificial electrodes as in claim 2, wherein said first and second sacrificial electrodes have digital configurations and interlace with each other.

4. Sacrificial electrodes as in claim 3, wherein the distance between said digital configurations of said first sacrificial electrode and said digital configurations of said second sacrificial electrode ranges from 0.1 micrometer to 10 micrometer.

5. Sacrificial electrodes as in claim 2, wherein said fractal configurations have first rank patterns.

6. Sacrificial electrodes as in claim 2, wherein said fractal configurations have second rank patterns.

7. Sacrificial electrodes as in claim 2, wherein said fractal configurations have third rank patterns.

8. Sacrificial electrodes as in claim 2, wherein said basic motif element of said fractal configurations includes triangle.

9. Sacrificial electrodes as in claim 2, wherein said first and second sacrificial electrodes are made of pyroelectric materials.

* * * * *